US006385077B1

(12) United States Patent
Kuo et al.

(10) Patent No.: US 6,385,077 B1
(45) Date of Patent: May 7, 2002

(54) NON-VOLATILE MEMORY CELL AND SENSING METHOD

(75) Inventors: Tung-Cheng Kuo, Yilan Hsien; Hsiang-Lan Lung, Hsinchu; Shue-Shuen Chen, Yunlin Hsien, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/732,019

(22) Filed: Dec. 8, 2000

(30) Foreign Application Priority Data

Oct. 24, 2000 (CN) ......................................... 089122380

(51) Int. Cl.$^7$ ............................................... G11C 11/22
(52) U.S. Cl. .................................. 365/145; 365/230.03
(58) Field of Search ........................... 365/145, 230.03, 365/129, 230.01

(56) References Cited

U.S. PATENT DOCUMENTS

| | | | | | |
|---|---|---|---|---|---|
| 5,774,392 | A | * | 6/1998 | Kraus et al. ................. | 365/145 |
| 6,072,711 | A | * | 6/2000 | Kang .......................... | 365/65 |
| 6,172,897 | B1 | * | 1/2001 | Shuto ......................... | 365/145 |
| 6,198,652 | B1 | * | 3/2001 | Kawakubo et al. ......... | 365/145 |

* cited by examiner

*Primary Examiner*—Hoai V. Ho

(57) ABSTRACT

A non-volatile ferroelectric capacitor memory of the present invention comprises a plurality of word lines located in parallel to each other, a plurality of bit lines across the word lines, a plurality of sensing ferroelectric capacitor connected to ground, a plurality of output transistors, and a plurality of memory cells located at intersections between each word line and bit line. In each of the memory cells including a depletion field effect transistor and a ferroelectric capacitor, the first electrode plate of the ferroelectric capacitor is connected to the depletion field effect transistor and the second electrode plate is connected to the bit line, and the gate electrode of the depletion field effect transistor is connected to the bit line.

10 Claims, 6 Drawing Sheets

NON-VOLATILE MEMORY CELL AND SENSING METHOD

FIELD OF THE INVENTION

The present invention relates to a non-volatile memory, and more particularly to a non-volatile ferroelectric capacitor memory and a method for sensing ferroelectric capacitor data in a memory cell.

BACKGROUND OF THE INVENTION

It is well known that ferroelectric material performs a hysteresis characteristic and is capable of retaining polarization state even when the applied power is removed from the material. Ferroelectric capacitors are fabricated by placing a layer of ferroelectric material between two conductive plates.

FIG. 1 illustrates a hysteresis curve of ferroelectrical material, wherein the abscissa represents the field voltage applied to the material and the ordinate represents the polarization of the material. If a capacitor is formed using a ferroelectric material between its plates, because of the hysteresis curve, the flow of current through the capacitor will depend on the prior history of the voltages applied to the device. If a ferroelectric capacitor is in a initial state on which zero volt is applied, point A or point D may indicate polarization. Assuming that point A in FIG. 1 indicates polarization, a positive voltage which is greater than the coercive voltage (referring to point B in FIG. 1) is applied across the capacitor, then the capacitor will conduct current and have a new polarization (referring to point C in FIG. 1) state. When the applied voltage is removed, the ferroelectric capacitor will maintain the same polarization state as shown at point D instead of returning to the state as shown at point A. A positive voltage continuously applying across the capacitor will cause a little change on the polarization. However, an enough negative voltage will cause the polarization to vary from point D to point E as indicated in FIG. 1. Once the negative voltage is removed from the capacitor, the ferroelectric capacitor will maintain the same polarization state and the curve moves to point A. Therefore, point A and point D respectively represent two different logical states when zero volt is applied across the capacitor.

Nonvolatile semiconductor ferroelectric memories can memorize "1" or "0" using different polarization state, and such polarization state will not be destroyed when the power is removed from the memory. Referring FIG. 2, conventional ferroelectric memory circuits include a word line 201, a bit line 203, a plate line 205 for driving ferroelectric capacitor and a memory cell 200 comprising a transistor 207 and a ferroelectric capacitor 209, wherein the transistor 207 and the ferroelectric capacitor 209 are located between the plate line 205 and the bit line 203. Memory cell 200 can be selected by inputing a signal in word line 201 to drive transistor 207, and then driving the plate line 205 with a pulse. If the ferroelectric capacitor initially stored the same polarization state, only small amount of electrical charge would be transferred from the ferroelectric capacitor 209 to the bit line 203. On the other hand, if the ferroelectric capacitor initially stored another polarization state, a large amount of electrical charge is transferred from the ferroelectric capacitor 209 to the bit line 203. A sensing amplifier circuit (not shown in the figure) is utilized to sense the charge transferred to the bit line 203, and then determine the polarization state initially stored in the ferroelectric capacitor.

Only a small amount of electrical charge is transferred from the ferroelectric capacitor 209 to the bit line 203 during the reading cycle, and which will not change the polarization state of the ferroelectric capacitor. Hence, the reading for the ferroelectric capacitor is a nondestructive read in the state. However, when the reading operation of a ferroelectric capacitor is accompanied by the transfer of a large amount of electrical charge to the bit line 203, the polarization state of ferroelectric capacitor will change to the other state. Hence, the reading of the ferroelectric capacitor is destructive read in the state. In order to maintain the original data (original polarization state), the conventional memory circuit need a restore cycle for restoring the original data due to the destructive read. In writing the data to the ferroelectric capacitor, the plate line 205 is pulsed with a positive or negative voltage, and then the ferroelectrical capacitor polarization state is determined based on the hysteresis curve.

SUMMARY OF THE INVENTION

The read operation cycle of a conventional ferroelectric capacitor memory circuit often involves a destructive read for the ferroelectric capacitor changes state from one polarization state to the other. In order to maintain the original data (original polarization state), the conventional memory circuit need a restore cycle for restoring the original data. The time required for restoring data may reduce the operation speed. In those reading operation cycles which include the destructive read and restoring cycle may result in the ferroelectric material "fatigue", which reduces the life. As a result of the "fatigue", the reliability and life of a ferroelectric capacitor is proportional to the number of times it has been read and write. If the power failed during the restoring operation period, the stored data would be destroyed.

FIG. 3 illustrates a nonlinear hysteresis curve due to the ferroelectric capacitor age through use. It becomes increasingly difficult to determine the correct polarization state. For example, if a ferroelectric capacitor of a memory cell is polarized at point A, a positive voltage greater than the coercive voltage is applied to the memory cell. The polarization state of the ferroelectric capacitor corresponding to the curve may be moved to the point C. When moving from point A to point C, the capacitor will conduct current. However, when reading from a ferroelectric capacitor of a memory cell, having polarity on point D by using a positive voltage, a current will be still introduced as the polarity curve moves to point C. The difference between the resultant currents of the two different states of the capacitor becomes smaller due to the capacitor age, which increases the difficult to determine the polarization state.

The present invention describes an integrated circuit memory comprising an array of ferroelectric memory cell comprising a transistor and a ferroelectric capacitor, a plurality of bit lines and a plurality of word lines. The present invention also describes a method for reading and writing data in memory cells.

From the foregoing, in accordance with the main purpose of this present invention, the disclosed ferroelectric memory circuit and the operation method reduce or eliminate the disadvantage and shortcomings associated with prior art. According to the invention, a ferroelectric capacitor may have different polarization states by applying a different driving pulse and the different polarization states may cause different output voltage. Hence, a ferroelectric capacitor is read by sensing the output voltage, and then determining the polarization state of the ferroelectric capacitor. The method avoids the shortcoming of the conventional method sensing electrical charge.

According to the present invention, the disclosed ferroelectric memory circuit and operation method adapted for reading ferroelectric capacitor such that the polarization states are not destroyed or switched to the other state and does not require a subsequent restore operation also. Hence, it does not affect the life or reliability of the capacitor due to fatigue result from the switch of polarization states. The present invention also disclosed a simple method for writing the polarization states of a memory cell.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
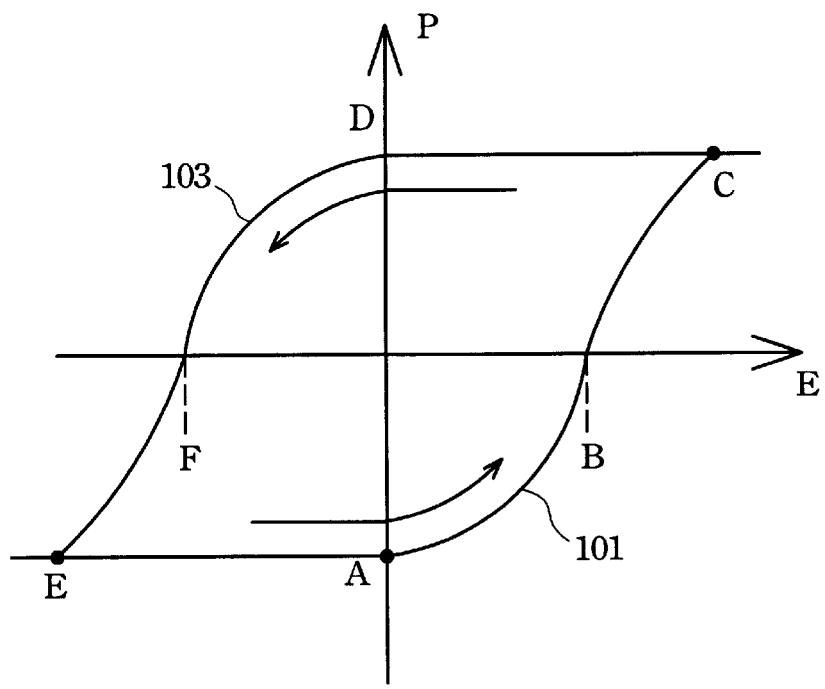
FIG. 1 depicts a hysteresis curve of a ferroelectric capacitor.
Figure 2:
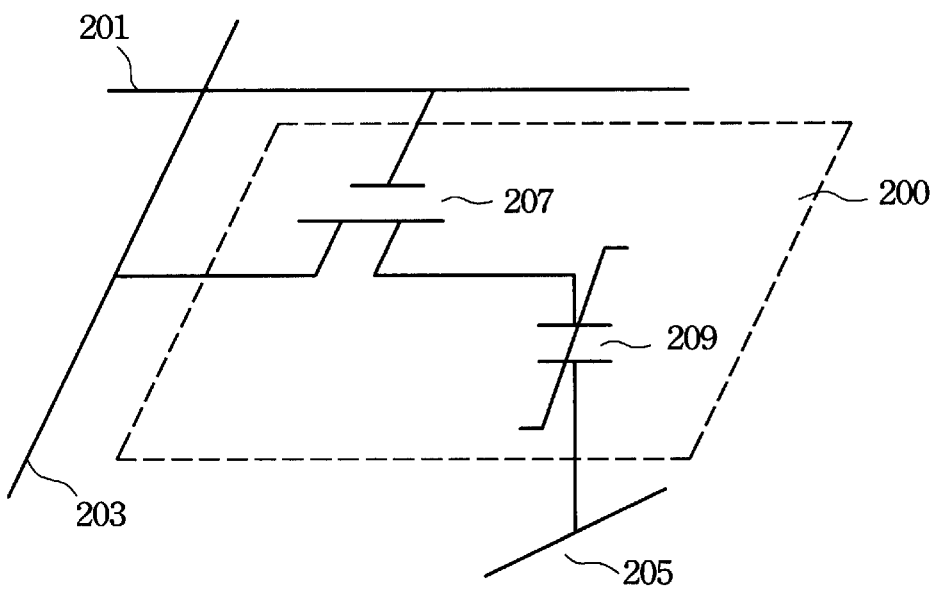
FIG. 2 depicts the circuit of a conventional ferroelectric memory cell.
Figure 3:
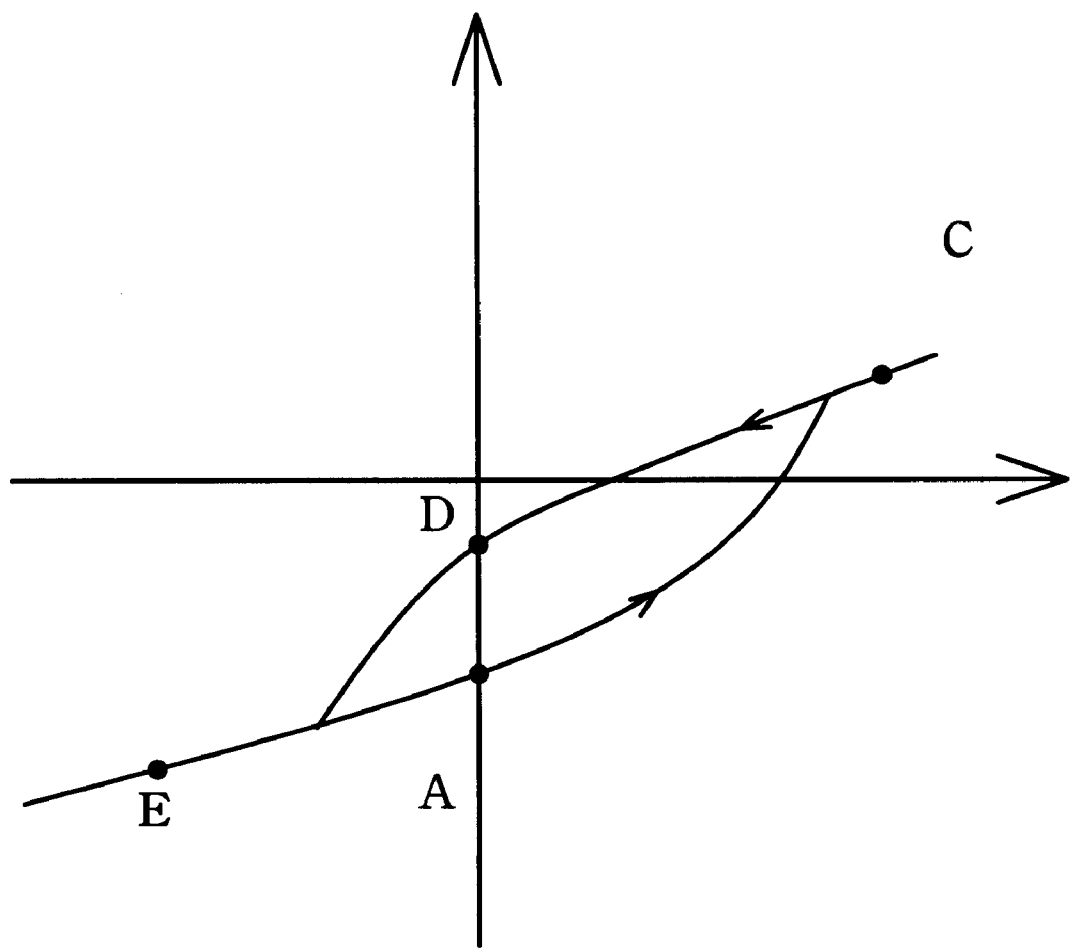
FIG. 3 depicts a hysteresis curve of an aged ferroelectric capacitor.

FIG. 1 illustrates a hysteresis curve of ferroelectric materials. The abscissa represents voltage applied to the ferrolectric materials, and the ordinate represents the polarization states. If the polarization state of a ferroelectric capacitor begins at point A and a positive voltage greater than coercive voltage (B point) is applied to it, the polarization state will follow the hysteresis curve 101 to transfer to point C, and introduce a current. On the other hand, if the polarization state of a ferroelectric capacitor begins at point D and a negative voltage greater than coercive voltage (F point) is applied to it, the polarization state will follow the hysteresis curve 103 to transfer to point E, and introduce a current.

Figure 4:
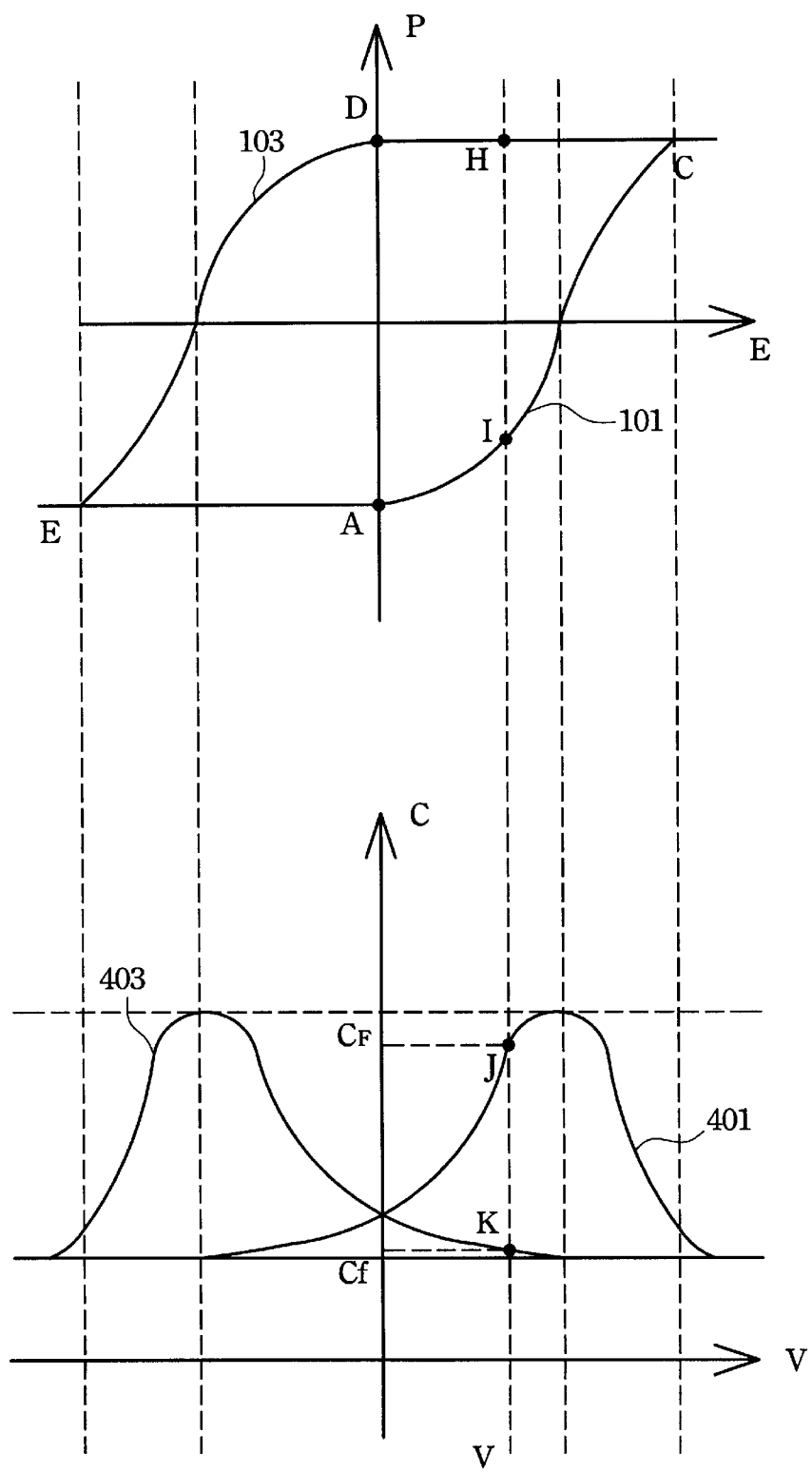
FIG. 4 depicts a capacitance with volatge curve according to the hysteresis curve of a ferroelectric capacitor.

FIG. 4 illustrates a capacitance Vs. voltage curve according to the hysteresis curve of a ferroelectric capacitor. Capacitance Vs. voltage curve 401 can be drawn according to the hysteresis curve 101 from point E to point C, wherein point J on the curve 401 refers to point I on the hysteresis curve 101. Capacitance Vs. voltage curve 403 can be drawn according to the hysteresis curve 103 from point C to point E, wherein point K on the curve 403 refers to point I on the hysteresis curve 101. It is assume that the different polarization states have been arranged to the two different ferroelectric capacitors, even though a same voltage is applied to the two ferroelectric capacitors respectively, the capacitance of the two ferroelectric capacitors are different. For example, if the first ferroelectric capacitor is polarized at point H and a positive voltage V is applied to it, the capacitance of the ferroelectric capacitor will be Cf according to K point on the curve 403. On the other hand, if the second ferroelectric capacitor is polarized at point I and a positive voltage V is applied to it, the capacitance of the ferroelectric capacitor will be CF according to J point on the curve 401.

Figure 5:
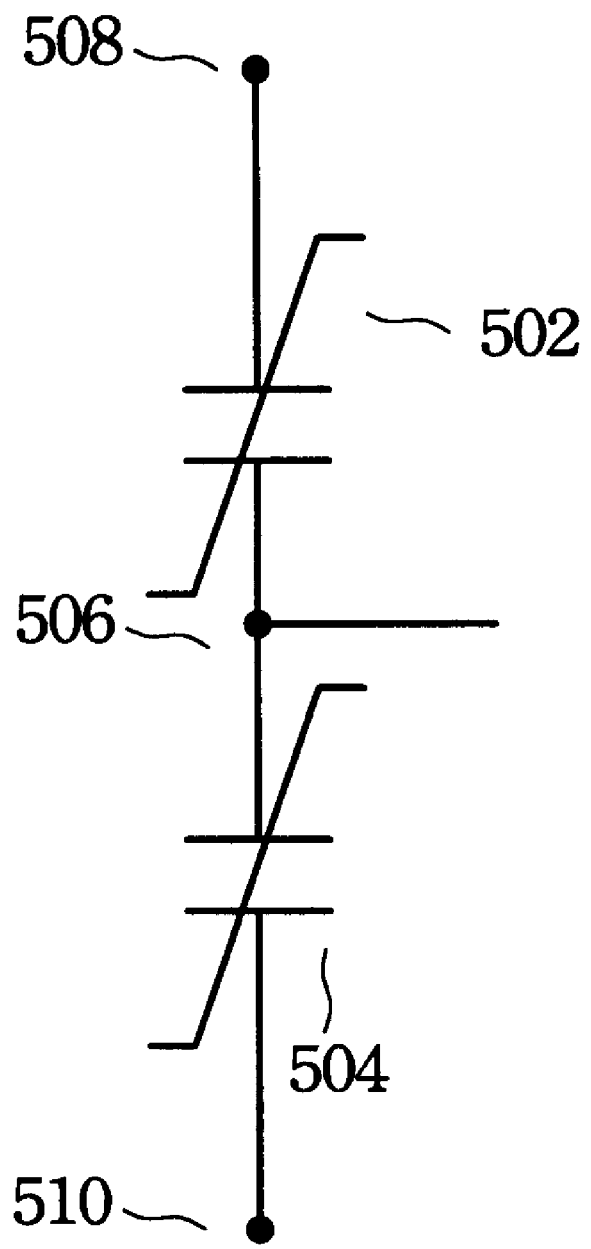
FIG. 5 depicts a capacitor divider of a ferroelectric capacitor.

FIG. 5 illustrates a divider 500 formed by two ferroelectric capacitors 502,504 connected in series. This arrangement has a common node 506 between them, and nodes 508 and 510 connects to each end of the capacitor respectively. If ferroelectric capacitors 502 and 504 have the same polarization state, and a voltage Vr is applied to terminals 508 and 510, the output voltage value Vg at node 506 will be 0.5 Vr because the capacitors have equal capacitance. If the polarization states of the capacitors are unequal, and a voltage Vr is applied to terminals 508 and 510, the output voltage value Vg at node 506 will be described as the following equation:

$$Vg = Vr^*(C_{502}/C_{502}+C_{504})$$

Wherein the $C_{502}$ represents the capacitance of ferroelectric capacitor 502, and $C_{504}$ represents the capacitance of ferroelectric capacitor 504. Therefore, the output voltage value Vg of common node 506 may be determined by setting the polarization states of capacitors 502 and 504. It is assume that the polarization state of ferroelectric capacitor 504 has been arranged as an especial polarization state, i.e., basic polarization state. The output voltage value Vg of common node 506 may be determined by setting the polarization states of capacitors 502. Hence, the polarization state, or so-called storage data, of ferroelectric capacitor can be determined by sensing the output voltage value Vg.

Figure 6:
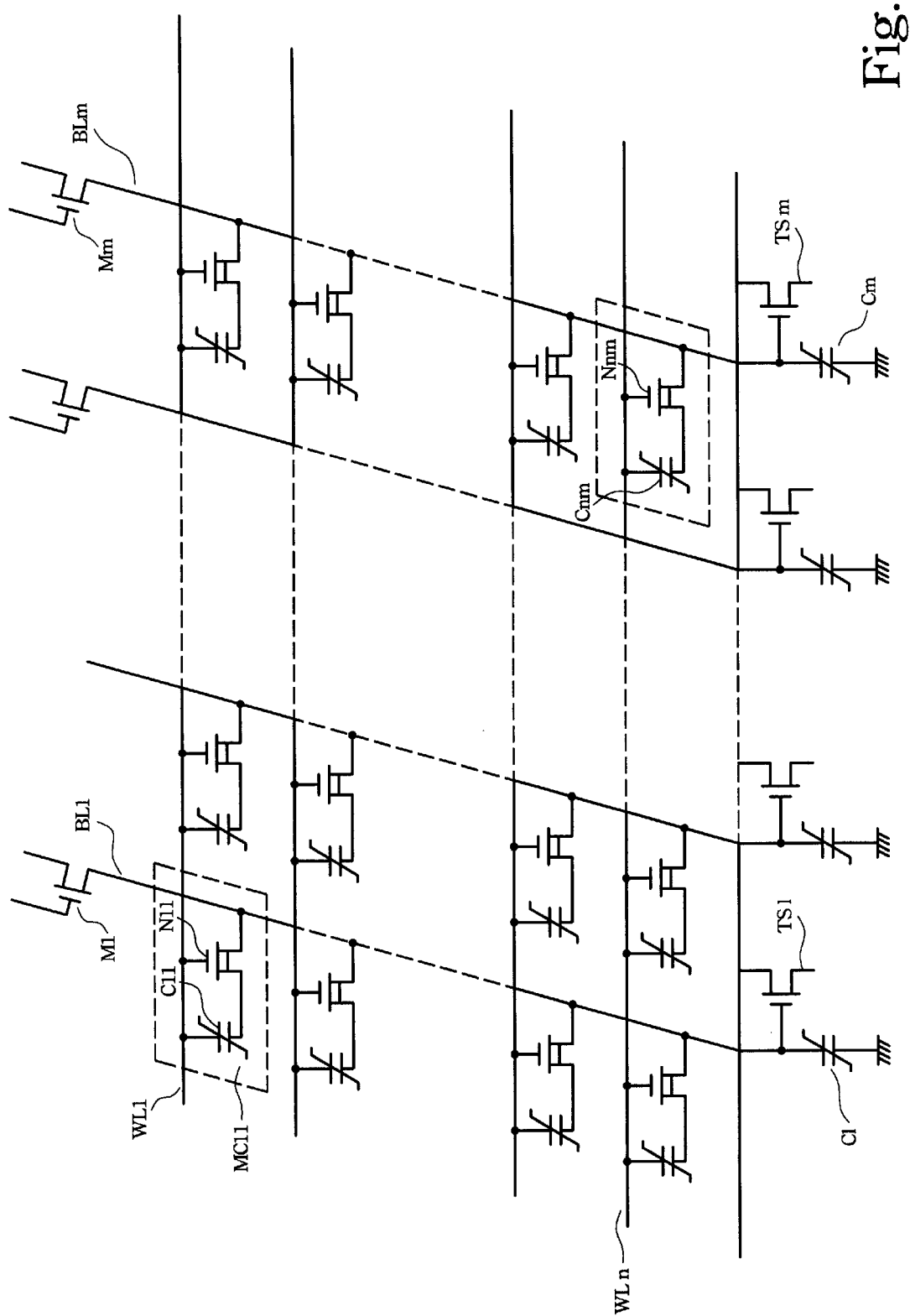
FIG. 6 depicts the circuit of the preferred embodiment according to the invention.

FIG. 6 depicts a preferred embodiment of the invention, wherein a preferred integrated ferroelectric memory circuit having ferroelectic capacitor divider, comprises a plurality of word lines $WL_1$–WLn, a plurality of bit lines $BL_1$–BLm, a plurality of sensing ferroelectric capacitors $C_1$–Cm which ground, a plurality of output transistors Ts1–Tsm and a plurality of memory cells $MC_{11}$–MCnm. A ferroelectric memory cell contains a depletion mode N type Metal-Oxide-Semiconductor transistor(N11–Nnm) and a ferroelectric capacitor (C11–Cnm). The polarization state of a sensing ferroelectric capacitor $C_1$–Cm has been arranged as an especially polarization state, i.e., basic polarization state, due to the sensing ferroelectric capacitor having the first terminal electrically coupled to a positive voltage and the second terminal electrically coupled to ground. Hence, the polarization state and capacitance of sensing ferroelectric capacitor $C_1$–Cm is respectively located on the hysteresis curve 101 of FIG. 1 and the capacitance Vs. voltage curve 401 of FIG. 4. A ferroelectric memory cell containing a ferroelectric capacitor and a depletion mode N type Metal-Oxide-Semiconductor transistor (N11–Nnm) electrically coupled in series between the first terminal of the ferroelectric capacitor and a bit line ($BL_1$–BLm). The second terminal of a ferroelectric capacitor is also electrically coupled to a word line ($WL_1$–WLn). Bit lines ($BL_1$–BLm) are also electrically coupled to sensing ferroelectric capacitor ($C_1$–Cm). Word lines ($WL_1$–WLn) are also electrically coupled to gate electrodes of the depletion mode N type Metal-Oxide-Semiconductor transistor (N11–Nnm).

When reading data from the memory cell MC11, firstly, a signal having a positive voltage is supplied to a selected word line WL1 connected to a gate of a depletion mode N type Metal-Oxide-Semiconductor transistor N11 of memory cell MC11, and the other word lines (WL2–WLn) are biased at negative voltage. The word line WL1 is brought to a high level so as to turn on the depletion mode N type Metal-Oxide-Semiconductor transistor N11, so that the word line WL1 is connected through the ferroelectric capacitor C11 and N type Metal-Oxide-Semiconductor transistor N11 to the bit line BL1. The bit line BL1 is connected through a sensing ferroelectric capacitor C1 to ground. As the result of selection, a current path is formed starting from the word line WL1, through the ferroelectric capacitor C11 and the N type Metal-Oxide-Semiconductor transistor N11, then to the bit line BL1 connected to the sensing ferroelectric capacitor C1 to ground. Mean while, a reference voltage is impressed at word line WL1, then the ferroelectric capacitors MC11, C1 operate as a voltage divider so that if the ferroelectric capacitors have the same polarization state, the voltage of the output transistor Ts1 is 0.5 Vr. If the ferroelectric capacitors have unequal polarization state, the voltage of the output transistor Ts1 is not equal to 0.5 Vr. It will therefore be appreciated that the process of setting the polarization of capacitors MC11 and C1. A voltage will be developed at the output transistor Ts1 which will depend on the polarization states of the ferroelectric capacitors MC11 and M1, and then sense the output voltage to determine the stored polarization states of ferroelectric capacitors.

Figure 7:
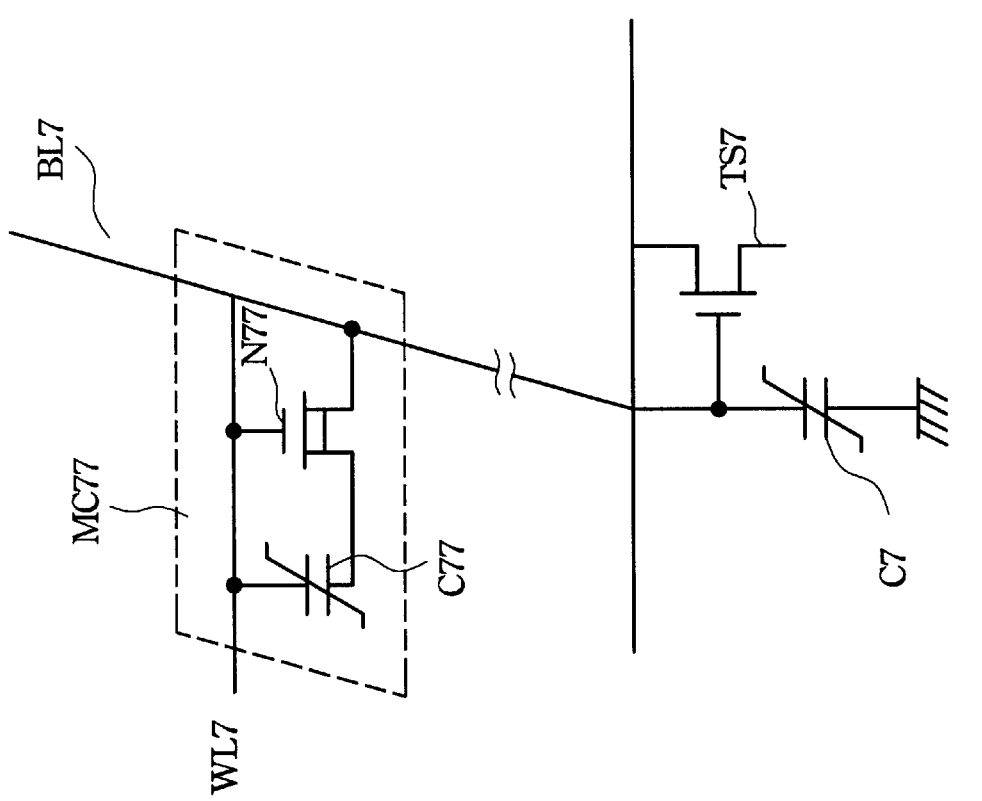
FIG. 7 depicts a portion of circuit of the preferred embodiment according to the invention.

FIG. 7 illustrates a memory cell MC77 including a ferroelectric capacitor C77 and a depletion mode N type Metal-Oxide-Semiconductor transistor N77. The gate of the transistor N77 is connected to a word line WL7. When data is read out from the memory cell MC77, a reference voltage is brought to word line WL7. If the ferroelectric capacitors C77 and C7 have equal polarization state, the voltage of the output transistor Ts7 is 0.5 Vr. When the ferroelectric capacitors C77 and C7 have unequal polarization state, for example, the polarization state and capacitance of the ferroelectric capacitor C77 have been respectively arranged on the hysteresis curve 103 (reference to FIG. 1) and the capacitance Vs. voltage curve 403 (reference to FIG. 4). On the other hand, the polarization state and capacitance of sensing ferroelectric capacitor C7 have been respectively arranged on the hysteresis curve 101 (reference to FIG. 1) and the capacitance Vs. voltage curve 401 (refer to FIG. 4). According to FIG. 4, the capacitance of the ferroelectric capacitor C77 may decrease while the volatge applied to the capacitor increases, referring to curve 403, and the capacitance of the sensing ferroelectric capacitor C7 may increase while the volatge applied to the capacitor increases, referring to curve 401. At the time, when a reference voltage is applied to the word line WL7, the voltage at the output transistor Ts7 will depend on the two capacitors C77 and C7. According to the output voltage, the polarization state (stored data) of the capacitor C77 can be determined. According to the present invention, this method eliminate the disadvantage associated with the conventional destructive read method by the plate line to change the polarization state of the ferroelectric capacitor to conduct electric charge. At the time, the present invention may also reduce the effect of the leakage current and noise of the ferroelectric capacitor because the present invention reads the data by sensing the output voltage unlike the conventional art is destructive read. The other aspect of the present invention is the window value between the ferroelectric capacitor C77 and sensing ferroelectric capacitor C7 may increase while the voltage is not greater than the coercive voltage applied to them increases, which makes it easier to recognize the change of output voltage.

Referring to FIG. 7, when data is written to memory cell MC77, for example, word line WL7 and bit line BL7 are firstly selected. When the ferroelectric capacitor C77 of memory cell MC77 is polarized according to hysteresis curve 101 (referring to FIG. 1), the word line WL7 is connected to a high level voltage and the bit line BL7 is connected to a low level voltage. When a reference voltage Vr is brought to word line WL7 the polarization states of capacitors C77 and sensing capacitor C7 are equal so that the voltage of output transistor Ts7 is 0.5 Vr. When the ferroelectric capacitor C77 of memory cell MC77 is polarized according to hysteresis curve 103 (referring to FIG. 1), the word line WL7 is connected to a low level voltage and the bit line BL7 is connected to a high level voltage. At this time, the polarization states of capacitors C77 and sensing capacitor C7 are unequal so that the voltage of output transistor Ts7 is defined by the following equation:

$$V(\text{output voltage}) = Vr*(C7/C7+C77)$$

Wherein C7 represents the capacitance of the sensing ferroelectric capacitor, and C77 represents the capacitance of the ferroelectric capacitor in memory cell MC77.

As understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A non-volatile ferroelectric capacitor memory having a plurality of basic memory units, each of the plurality of units comprising:

a plurality of word lines located in parallel to each other;

a bit line across the word lines;

a ferroelectric capacitor, comprising a first electrode plate connected the end of said bit line, and a second electrode plate connected to ground; and a plurality of memory cells located at intersections between said plurality of word lines and said bit line, each of said memory cells further including a depletion field effect transistor and a ferroelectric capacitor, wherein the first electrode plate of said ferroelectric capacitor is connected to said depletion field effect transistor and the second electrode plate is connected to said word line.

2. The basic memory unit as claimed in claim 1, wherein the depletion field effect transistor is a N-type depletion field effect transistor.

3. The basic memory unit as claimed in claim 1, wherein the depletion field effect transistor is a P-type depletion field effect transistor.

4. A method for sensing a non-volatile ferroelectric capacitor memory having a plurality of memory cells, a plurality of word lines and a plurality of bit lines wherein the end of each of said plurality of bit lines is connected to a grounded ferroelectric capacitor, comprising the steps of:

selecting a word line, biasing said word line to a voltage level, and then biasing the other word lines to an opposite voltage level to determine row address;

selecting a bit line to determine column address, and employing said selected word line and said selected bit line to determine a memory cell;

applying a reference voltage to said selected word line; and sensing the voltage on an end of said bit line to determine the polarization state of ferroelectric capacitor in said memory cell.

5. The method as claimed in claim 4, wherein the depletion field effect transistor is a N-type depletion field effect transistor.

6. The method as claimed in claim 4, wherein the depletion field effect transistor is a P-type depletion field effect transistor.

7. A method for writing data into a non-volatile ferroelectric capacitor memory having a plurality of memory cells, a plurality of word lines and a plurality of bit lines wherein the end of each of said plurality of bit lines is connected to a grounding ferroelectric capacitor, comprising the steps of:

selecting a word line to determine the row address, biasing said word line to a voltage level, and biasing the other plurality of word lines to an opposite voltage level;

selecting a bit line to determine the column address, and employing said selected word line and said selected bit line to determine a memory cell;

setting said selected word line to a high voltage; and setting said selected bit line to a low voltage.

8. A method for writing data into a non-volatile ferroelectric capacitor memory having a plurality of memory cells, a plurality of word lines and a plurality of bit lines, wherein the end of each of said plurality of bit lines is connected to a grounding ferroelectric capacitor, comprising the steps of:

selecting a word line to determine the row address, biasing said word line to a voltage level, and biasing the other plurality of word lines to an opposite voltage level;

selecting a bit line to determine the column address, and employing said selected word line and said selected bit line to determine a memory cell;

setting said selected word line to a low voltage; and setting said selected bit line to a high voltage.

9. The method as claimed in claim 7, wherein the depletion field effect transistor is a N-type depletion field effect transistor.

10. The method as claimed in claim 7, wherein the depletion field effect transistor is a P-type depletion field effect transistor.

* * * * *